United States Patent [19]

Takaki

[11] Patent Number: 5,638,408
[45] Date of Patent: Jun. 10, 1997

[54] VARIABLE TRANSMISSION BIT RATE DISCRIMINATION METHOD AND APPARATUS

[75] Inventor: Tetsuya Takaki, Tokyo, Japan

[73] Assignee: NEC Corporation, Japan

[21] Appl. No.: 555,890

[22] Filed: Nov. 13, 1995

[30] Foreign Application Priority Data

Nov. 14, 1994 [JP] Japan .................................. 6-304363

[51] Int. Cl.⁶ .................................................. H04L 27/06
[52] U.S. Cl. ............................ 375/341; 375/262; 371/43
[58] Field of Search ............................... 375/262, 341, 375/340, 377; 371/43

[56] References Cited

U.S. PATENT DOCUMENTS

| | | | |
|---|---|---|---|
| 5,050,191 | 9/1991 | No ................................... | 375/341 |
| 5,134,635 | 7/1992 | Hong et al. ...................... | 375/341 |
| 5,457,705 | 10/1995 | Todoroki ......................... | 371/43 |

FOREIGN PATENT DOCUMENTS

| | | |
|---|---|---|
| 1-44056 | 9/1989 | Japan . |
| 4-314289 | 11/1992 | Japan . |
| 4-331519 | 11/1992 | Japan . |

OTHER PUBLICATIONS

J.K. Hinderling, et al., "CDMA Mobile Station Modem ASIC", EIII Journal of Solid-State Circuits, vol. 28, No. 3, Mar. 1993, pp. 253-260.

*Primary Examiner*—Stephen Chin
*Assistant Examiner*—T. Ghebretinsae
*Attorney, Agent, or Firm*—Ostrolenk, Faber, Gerb & Soffen, LLP

[57] ABSTRACT

The invention provides a variable bit rate discrimination method and apparatus wherein a transmission bit rate of data received by a mobile station in a mobile communication which employs a spectrum spreading method can be discriminated readily to realize reduction in time required for decoding processing and miniaturization in circuit scale. A variable bit rate including four different transmission bit rates is used as a transmission rate of a traffic channel from a base station to a mobile station, and transmission data are encoded using convolutional encoder for error correction and transmitted. In the mobile station, received data are decoded for the four individual transmission bit rates using Viterbi decoders to obtain path metric values which are sum totals of errors of the received data. Then, one of the transmission bit rates which exhibits a lowest one of the path metric values is selected as a bit rate used for transmission of the transmission data. Consequently, after Viterbi decoding, no further encoding is required.

3 Claims, 3 Drawing Sheets

VARIABLE TRANSMISSION BIT RATE DISCRIMINATION METHOD AND APPARATUS

BACKGROUND OF THE INVENTION

1. Field of the Invention

This invention relates to a method of and apparatus for discriminating a variable transmission bit rate in a mobile communication system, and more particularly to a transmission bit rate discrimination method and apparatus for a variable bit rate mobile communication system (TIA·IS-95) wherein spectrum spreading which was standardized in the North America in July, 1993 is employed.

2. Description of the Related Art

Generally, in a mobile communication which employs spectrum spreading, when a base station communicates with a mobile station, it performs signal processing such as error correction and block interleaving (multiplexing) of a signal such as speech or data to be transmitted and then performs modulation of the signal using PSK (Phase Shift Keying) or the like, whereafter it spreads the spectrum in a wide bandwidth using a code such as a PN (Pseudo Noise) spread code (pseudonoise spread signal) and transmits the signal of the spread spectrum.

The data transmitted in this manner are despread, in the mobile station, using a PN code sequence same as and synchronized with that used in the base station and is then demodulated to obtain a signal of a base band, and the base band signal is processed by signal processing such as error correction and deinterleaving to extract an original signal of speech, data or the like.

In the TIA·IS-95, when a base station communicates with a mobile station, such signal processing as illustrated in FIG. 3 is performed in a traffic channel to transmit a signal.

Referring to FIG. 3, a variable bit rate is realized using four different transmission bit rates of 9.6 Kbps, 4.8 Kbps, 2.4 Kbps and 1.2 Kbps for data to be transmitted in a traffic channel. Information bits (101) which are transmission data to be transmitted at any of the transmission bit rates is first processed by a calculation of CRC (Cyclic Redundancy Check) data for error detection and a process (102) of adding a result of the calculation to the information bits (only when the transmission bit rate is 4.8 Kbps or 9.6 Kbps). Then, 8 bits are added as tail bits for convolutional encoding to the information bits (103).

The information bits at any of the transmission bit rates to which the CRC error detection data and the tail bits have been added are processed by convolutional encoding for error correction (104), and transmission symbols are transmitted repetitively in accordance with the transmission bit rate (105).

In this instance, the rate of repetitions of transmission symbols is zero at 9.6 Kbps, one at 4.8 Kbps, three at 2.4 Kbps and seven at 1.2 Kbps.

Thereafter, block interleaving processing (106) is performed, and using a long code generated by means of a 42-b PN code generator (1010), the transmission data are scrambled (107) by way of decimators (1011) and (1012). Further, information for power control is inserted into the transmission data (108) and the spectrum of the transmission data are spreaded in a wide bandwidth, and the transmission data are modulated (109). Then the modulated transmission data are transmitted.

In the mobile communication system which employs such spectrum spreading as described above, the transmission bit rate is discriminated by various methods in the mobile station. According to one method, the mobile station demodulates received data, despreads the demodulated data, descrambles the despread data, block interleaves the descrambled data to vary the order of the received data, performs Viterbi decoding corresponding to the four transmission bit rates, re-encodes results of the decoding using a convolutional encoder same as that of the base station, compares the re-encoded data with the data before the Viterbi decoding to detect correlations between them, and discriminates one of the results of the decoding which exhibits a maximum correlation as the data transmitted to the mobile station and discriminates the transmission bit rate from the discriminated transmission data.

However, if it is tried to discriminate a transmission bit rate using the conventional method described above, after Viterbi decoding is performed for the four different transmission bit rates, the decoded data must be re-encoded by convolutional encoders. Consequently, the conventional method is disadvantageous in that much time is required for the processing of the received data. Further, since convolutional encoders are required in each base station, the conventional method is disadvantageous also in that the circuit scale is increased as much, which makes an obstacle to miniaturization of the apparatus.

Various other techniques for coding/decoding transmission data are already known. One of known coding/decoding techniques is disclosed, for example, in Japanese Patent Publication Application No. Heisei 1-44056 wherein a high frequency self running clock is built in a Viterbi decoder so that internal signal processing can be processed serially in a time division relationship at a high rate. Another coding/decoding technique is disclosed in Japanese Patent Laid-Open Application No. Heisei 4-314289 wherein a decoding signal in a high definition television receiver is passed on to a quantization decoder which operates in response to a vector code book and a quantizing vector signal transmitted thereto and an output signal of the quantization decoder is passed on to an inverse discrete cosine transform (DCT) circuit. A further coding/decoding technique is disclosed in Japanese Patent Laid-Open Application No. Heisei 4-331519 wherein a format is conformed to different rates of audio encoders/decoders so that data can be transmitted at a variable rate in a same frame. However, those techniques cannot successfully eliminate the disadvantages of the conventional method described above.

SUMMARY OF THE INVENTION

It is an object of the present invention to provide a variable bit rate discrimination method and apparatus wherein a transmission bit rate of received data in a mobile communication which employs a spectrum spreading method can be discriminated readily to realize reduction in processing time of the received data and miniaturization in circuit scale of a base station.

In order to attain the object described above, according to an aspect of the present invention, there is provided a method of discriminating a variable bit rate in a mobile communication system wherein a variable bit rate including four different transmission bit rates is used as a transmission rate of a traffic channel from a base station to a mobile station and transmission data are encoded using convolutional encoding for error correction and transmitted, comprising the steps of decoding, in the mobile station, received data for the four individual transmission bit rates using Viterbi decoders to obtain path metric values which are sum totals of errors of the received data, together with results of decoding for the transmission bit rates, comparing the path metric values for the four transmission bit rates in magnitude with each other, and selecting one of the transmission bit rates which exhibits a lowest path metric value as a bit rate at which the transmission data have been transmitted.

According to another aspect of the present invention, there is provided a variable bit rate discrimination apparatus for a mobile communication system wherein a variable bit rate including four different transmission bit rates is used as a transmission rate of a traffic channel from a base station to a mobile station and transmission data are encoded using convolutional encoder for error correction and transmitted, the variable bit rate discrimination apparatus being provided in the mobile station, the variable bit discrimination apparatus comprising means for demodulating received data from the base station and despreading a spectrum of the received data, means for descrambling the received data based on information passed on thereto from the base station on a synchronization channel, means for block interleaving the descrambled received data to restore an original order of the received data, received symbol adders for adding the block interleaved received data of the individual transmission bit rates by repetition symbol rates corresponding to the transmission bit rates, calculators for calculating branch metrics for use for Viterbi decoding based on the thus added received data, Viterbi decoders for performing Viterbi decoding based on values of the thus calculated branch metrics and outputting results of the decoding and path metric values for the individual transmission bit rates, a comparator for comparing the path metric values outputted from the Viterbi decoders with each other in magnitude and selecting and outputting a lowest one of the path metric values, and a switch for selecting, in response to an output of the comparator, one of output terminals of the Viterbi decoders from which the received data of the transmission bit rate having the lowest path metric value are outputted and connecting the selected output terminal to an information source decoder for information bits of the received data.

In the variable bit rate discrimination method and apparatus, while the base station performs convolution coding processing for error correction of transmission data and transmits the transmission data at a variable bit rate using four different transmission bit rates, the mobile station performs Viterbi decoding, which is one of maximum likelihood decoding methods for decoding convolutional encoded data, for each of the four different transmission bit rates. The path metrics which are sum totals of errors which are produced by the decoders are compared with each other in magnitude, and the decoded data which exhibits the lowest path metric is determined as a result of the maximum likelihood decoding. Then, the bit rate is discriminated based on the result of the maximum likelihood decoding. Consequently, the necessity for re-encoding, after Viterbi decoding, the decoded data using a convolutional encoder as in the conventional method is eliminated. Accordingly, the variable bit rate discrimination method and apparatus is advantageous in that the processing time required for decoding can be reduced and an increase in circuit scale can be prevented to achieve miniaturization of the apparatus.

The above and other objects, features and advantages of the present invention will become apparent from the following description and the appended claims, taken in conjunction with the accompanying drawings.

DESCRIPTION OF THE PREFERRED EMBODIMENT

Figure 1:
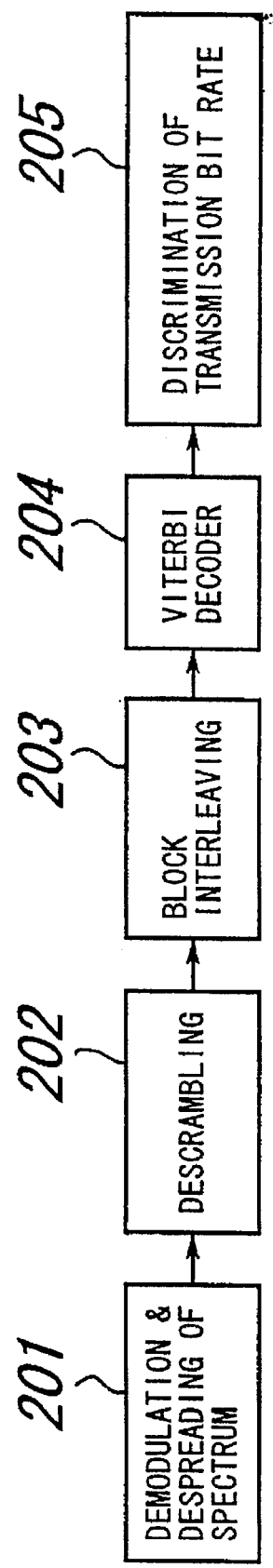
FIG. 1 is a flow diagram illustrating a procedure of decoding processing of data received in a traffic channel by a mobile station according to the present invention.

Referring first to FIG. 1, there is illustrated in flow chart a procedure of decoding processing of data received in a traffic channel by a mobile station in a mobile communication which employs the spectrum spreading communication method. Data received by the mobile station are first demodulated and then despreading processing of the spectrum is performed (201). Then, a long code is generated based on information transmitted to the mobile station from the base station on a synchronization channel to descramble the demodulated despread data (202). Thereafter, block interleaving is performed to restore the order of the received data (203), and then, Viterbi decoding is performed parallelly for the four different transmission bit rates (204). Then, the transmission bit rate is discriminated based on four path metric values obtained by the Viterbi decoding (205).

Figure 2:
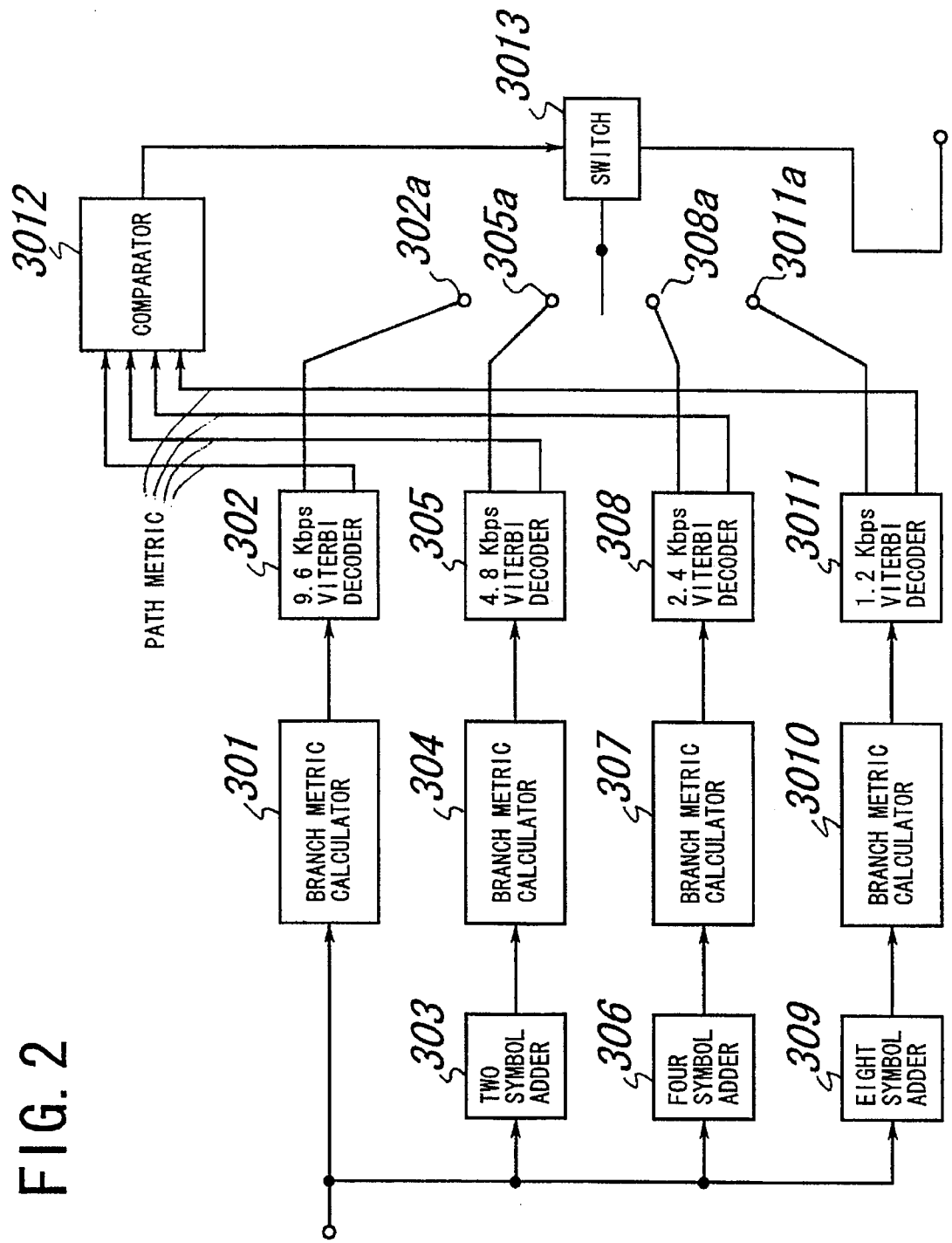
FIG. 2 is a block diagram showing a circuit construction for Viterbi decoding and discrimination processing of a transmission bit rate according to the present invention.
Figure 3:
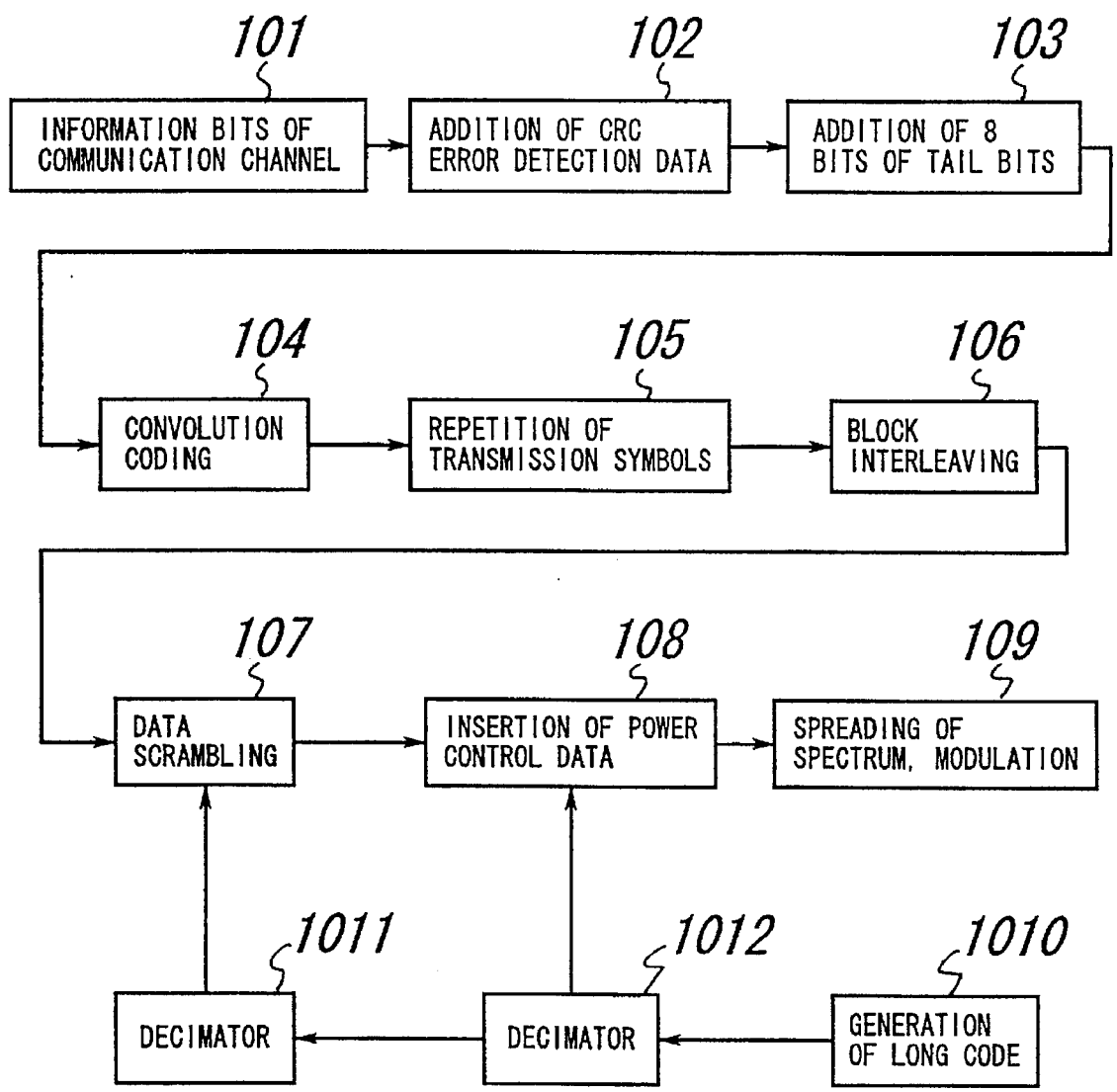
FIG. 3 is a flow diagram illustrating a procedure of data coding processing performed in a traffic channel by a base station according to the TIA-IS-95.

FIG. 2 shows the circuit construction for the discrimination processing of the transmission bit rate and illustrates details of the Viterbi decoding processing (204) and the transmission bit rate discrimination processing (205) illustrated in FIG. 1.

Referring to FIG. 2, the circuit shown includes adders 303, 306 and 309 for received symbols, calculators 301, 304, 307 and 3010 for calculating branch metrics, Viterbi decoders 302, 305, 308 and 3011 corresponding to the individual transmission bit rates, a comparator 3012 for comparing the values of the path metrics with each other, and a switch 3013 which switches in response to a result of the comparison by the comparator 3012. The switch 3013 has four terminals, 302a, 305a, 308a and 3011a which are respectively connected to Viterbi decoders 302, 305, 308 and 3011.

Received data which have been processed by block interleaving (203) in FIG. 1 are added for individual symbols by repetition symbol rates by the adders 303, 306 and 309 for received symbols. In particular, addition is performed by zero time at 9.6 Kbps; by one time at 4.8 Kbps; by three times at 2.4 Kbps; and by seven times at 1.2 Kbps.

The thus added individual received data are inputted to the calculators 301, 304, 307 and 3010, respectively, so that calculation of branch metrics for use for Viterbi decoding is performed by them, respectively.

The values of the branch metrics calculated by the calculators 301, 304, 307 and 3010 are inputted to the Viterbi decoders 302, 305, 308 and 3011 corresponding to the individual transmission bit rates so that Viterbi decoding thereof is performed, respectively. Consequently, results of the decoding and the values of the path metrics are outputted from the Viterbi decoders 302, 305, 308 and 3010.

The values of the four path metrics are inputted to the comparator 3012, in which they are compared in magnitude with each other. The comparator 3012 discriminates that one of the results of the decoding which exhibits a lowest path metric value as the transmission bit rate used to transmit the transmission data. The comparator 3012 thus outputs a signal of the thus discriminated transmission bit rate.

The switch 3013 is switched, in response to the signal from the comparator 3012, to one of the four terminals 302, 305, 308 and 3011 thereof for outputting results of decoding by the Viterbi decoders from which the received data of the transmission bit rate having the lowest path metric value are to be outputted. Consequently, only the received data of the transmission bit rate are allowed to be transmitted to means for decoding an information source at a next stage of processing.

Having now fully described the invention, it will be apparent to one of ordinary skill in the art that many changes and modifications can be made thereto without departing from the spirit and scope of the invention as set forth herein.

What is claimed is:

1. A method of discriminating a variable bit rate in a mobile communication system, wherein four transmission bit rates are used for a transmission rate of a traffic channel from a base station to a mobile station and transmission data are encoded using a convolutional encoder for error correction and are transmitted, the method comprising the steps of:

decoding, in the mobile station, received data for the four individual transmission bit rates using Viterbi decoders to obtain path metric values which are sum totals of errors of the received data, together with results of decoding for the transmission bit rates;

comparing the four path metric values in magnitude with each other; and selecting one of the four transmission bit rates which exhibits a lowest path metric value as a bit rate at which the transmission data have been transmitted.

2. A variable bit rate discrimination apparatus for a mobile communication system, wherein said variable bit rate including four different transmission bit rates is used as a transmission rate of a traffic channel from a base station to a mobile station and transmission data are encoded using convolutional encoder for error correction and transmitted, said variable bit rate discrimination apparatus being provided in the mobile station, said variable bit discrimination apparatus comprising:

means for demodulating received data from the base station and despreading a spectrum of the received data;

means for descrambling the received data based on information passed on thereto from the base station on a synchronization channel;

means for block interleaving the descrambled received data to restore an original order of the received data;

received symbol adders for adding the block interleaved received data of the individual transmission bit rates by repetition symbol rates corresponding to the transmission bit rates;

calculators for calculating branch metrics for use for Viterbi decoding based on the thus added received data;

Viterbi decoders for performing Viterbi decoding based on values of the thus calculated branch metrics and outputting results of the decoding and path metric values for the individual transmission bit rates;

a comparator for comparing the path metric values outputted from said Viterbi decoders with each other in magnitude and selecting and outputting a lowest one of the path metric values; and a switch for selecting, in response to an output of said comparator, one of output terminals of said Viterbi decoders from which the received data of the transmission bit rate having the lowest path metric value are outputted and connecting the selected output terminal to an information source decoder for information bits of the received data.

3. A variable bit rate discrimination apparatus for a mobile communication system, wherein said variable bit rate including four different transmission bit rates is used as a transmission rate of a traffic channel from a base station to a mobile station and transmission date are encoded using convolutional encoder for error correction and transmitted, said variable bit rate discrimination apparatus being provided in the mobile station, said variable bit discrimination apparatus comprising:

demodulation to demodulate received data from the base station and despreading a spectrum of the received data;

descrambler to descramble the received data based on information passed on thereto from the base station on a synchronization channel;

block interleaver to block interleave the descrambled received data to restore an original order of the received data;

received symbol adders for adding the block interleaved received data of the individual transmission bit rates by repetition symbol rates corresponding to the transmission bit rates;

calculators for calculating branch metrics for use for Viterbi decoding based on the thus added received data;

Viterbi decoders for performing Viterbi decoding based on values of the thus calculated branch metrics and outputting results of the decoding and path metric values for the individual transmission bit rates;

a comparator for comparing the path metric values outputted from said Viterbi decoders with each other in magnitude and selecting and outputting a lowest one of the path metric values; and a switch for selecting, in response to an output of said comparator, one of output terminals of said Viterbi decoders from which the received data of the transmission bit rate having the lowest path metric value are outputted and connecting the selected output terminal to an information source decoder for information bits of the received data.

* * * * *